United States Patent [19]

Bodewig

[11] 4,410,127
[45] Oct. 18, 1983

[54] METHOD OF SOLDERING PINS TO PRINTED CIRCUIT BOARDS, AND SOLDERING BATH FOR THIS METHOD

[75] Inventor: Manfred Bodewig, Monchen-Gladbach, Fed. Rep. of Germany

[73] Assignee: U.S. Philips Corporation, New York, N.Y.

[21] Appl. No.: 236,359

[22] Filed: Feb. 20, 1981

[30] Foreign Application Priority Data

Feb. 21, 1980 [DE] Fed. Rep. of Germany ....... 3006431

[51] Int. Cl.³ .............................................. B23K 3/06
[52] U.S. Cl. .................................. 228/180 A; 228/37; 228/180 R
[58] Field of Search ................. 228/180 A, 180 R, 37; 118/404, 405

[56] References Cited

U.S. PATENT DOCUMENTS 3,604,609  9/1971  Walls ........................... 228/180 R X
3,726,465  4/1973  Boynton et al. ..................... 228/37
3,921,888  11/1975  Elliott et al. ..................... 228/180 R
4,170,326  10/1979  Wright ............................. 228/180 R

FOREIGN PATENT DOCUMENTS 53-47803  3/1978  Japan ..................................... 228/37
2029750  3/1980  United Kingdom ............ 228/180 R

OTHER PUBLICATIONS

Western Electric, *Technical Digest*, No. 44, pp. 45-46, Oct. 1976, by Western Electric Co.

*Primary Examiner*—Kenneth J. Ramsey
*Attorney, Agent, or Firm*—David R. Treacy

[57] ABSTRACT

A method of soldering connection pins on carrier strips to printed circuit boards, notably to thick-film modules. Prior to soldering in a soldering bath, a printed circuit board is detachably connected to the connection pins. An endless carrier strip with the connection pins and printed circuit boards in the upright position is horizontally fed through liquid solder which flows off the components to be soldered at the surface. Solder which does not wet or connect the components flows away at the end of the predetermined soldering path, preferably in the transport direction of the parts, to a level below that of the carrier strip.

5 Claims, 3 Drawing Figures

METHOD OF SOLDERING PINS TO PRINTED CIRCUIT BOARDS, AND SOLDERING BATH FOR THIS METHOD

BACKGROUND OF THE INVENTION

The invention relates to a method of soldering connection pins on carrier strips to printed circuit boards, notably to thick-film modules, the printed circuit boards being detachably arranged on the connection pins prior to soldering; and also relates to a dip soldering bath for performing this method.

Carrier strips with connection pins are well known and are industrially used. The carrier strips serve for the orderly and mechanized feeding of the individual connection pins to the relevant processing positions. Because the connection pins are normally fed to the processing positions by way of carrier strips provided on each end of the connection pins, the carrier strip provided near the connection tulip is removed before soldering, but the opposite carrier strip is removed only after the soldering of the connection pins.

Thick-film hybrid modules are the printed circuit boards which are most suitable for the use of such connection pins. In these modules, the conductor tracks extend very closely along the connection areas of the connection pins over a part of their length. This means that the soldering of the connection pins has to be extremely accurately performed. Furthermore, it is important that the bases of the connection pins adjacent the carrier strips exhibit as few solder bridges as possible after removal from the soldering bath, as the adjacent edge of the carrier strips acts as reference surface during its removal.

Thick-film hybrid modules comprising clamping connection pins are known to be dipped, together with the carrier strips extending from the bases of the connection pins, either individually or in small groups into the soldering bath in the upright position. However, solder bridging problems are then encountered.

SUMMARY OF THE INVENTION

The invention has for its object to provide a method of soldering connection pins on carrier strips to printed circuit boards where an accurately defined soldering level is reached, and solder bridges at the bases of the connection pins are avoided. Moreover, continuous processing of endless carrier strips with connection pins and printed circuit boards should be possible.

This is achieved by a method in accordance with the invention in that an endless carrier strip with the connection pins and the printed circuit boards which are supported by the carrier strip in the upright position is horizontally fed through liquid solder which flows off the parts to be soldered at the surfadce, the solder excess which does not wet and connect the parts preferably flowing in the transport direction of the parts at the end of the predetermined soldering path and being subsequently removed from the wetted parts to a level below the carrier strip.

Due to the fact that the carrier strips with the connection pins and printed circuit boards are pulled through the solder which at least in the upper zone constantly flows off the components to be soldered, the solder surface is always free from oxide residues so that a uniform solder surface is ensured. As a result, extremely accurate level-oriented soldered connections can be realized. Because the solder flows in the transport direction and to a lower level at the end of the soldering path, there will be no bridges at the bases of the connection pins. This results from the fact that the flowing solder takes along all solder particles which do not adhere to the parts to be soldered under the influence of wetting.

The soldering bath used for performing the solder method is characterized in that it comprises a soldering nozzle which projects from the soldering bath and in which the carrier strip with the connection pins can be dipped, said nozzle comprising recesses located at the transport path of the carrier strip and extending downward from an overflow rim towards the soldering bath at least as far as the dipping depth of the carrier strip, the lower edges of the recesses being situated above the level of the solder in the soldering bath. This construction of the soldering nozzle ensures that the solder which is supplied from below continuously flows over the overflow rim of the soldering nozzle and follows a flow direction from the parts fed through the soldering nozzle to the overflow rim of the soldering nozzle. The carrier strip and the parts present thereon are fed through the recesses into the soldering nozzle and subsequently out again. The recesses not only serve to admit and permit removal of the carrier strips, but also cause a flow direction of the solder along the carrier strip and the parts present thereon. Thus, at the recesses, the solder preferably flows in the longitudinal direction of the carrier strip and the parts. Because the bath surface is lower than the recesses, the solder can flow downwards from the nozzle into the bath.

In a further preferred embodiment in accordance with the invention, a supporting strip for the carrier strip is provided between the lower sides of the recesses. This supporting strip may be connected, for example, to both end faces of the soldering nozzle and supports the carrier strip which need not be supported between a device for the application of a flux and a drying zone.

In a further preferred embodiment in accordance with the invention, the supporting strip comprises openings in order to ensure circulation of the solder also to the edge of the carrier strip extending across the supporting strip.

In a further preferred embodiment in accordance with the invention, a tin scraper is provided outside one of the recesses of the soldering nozzle. This tin scraper ensures that no tin or oxide residues can adhere to the lower side of the carrier strip.

The invention will be described in detail hereinafter with reference to the accompanying drawing.

DESCRIPTION OF THE PREFERRED EMBODIMENT

Figure 1:
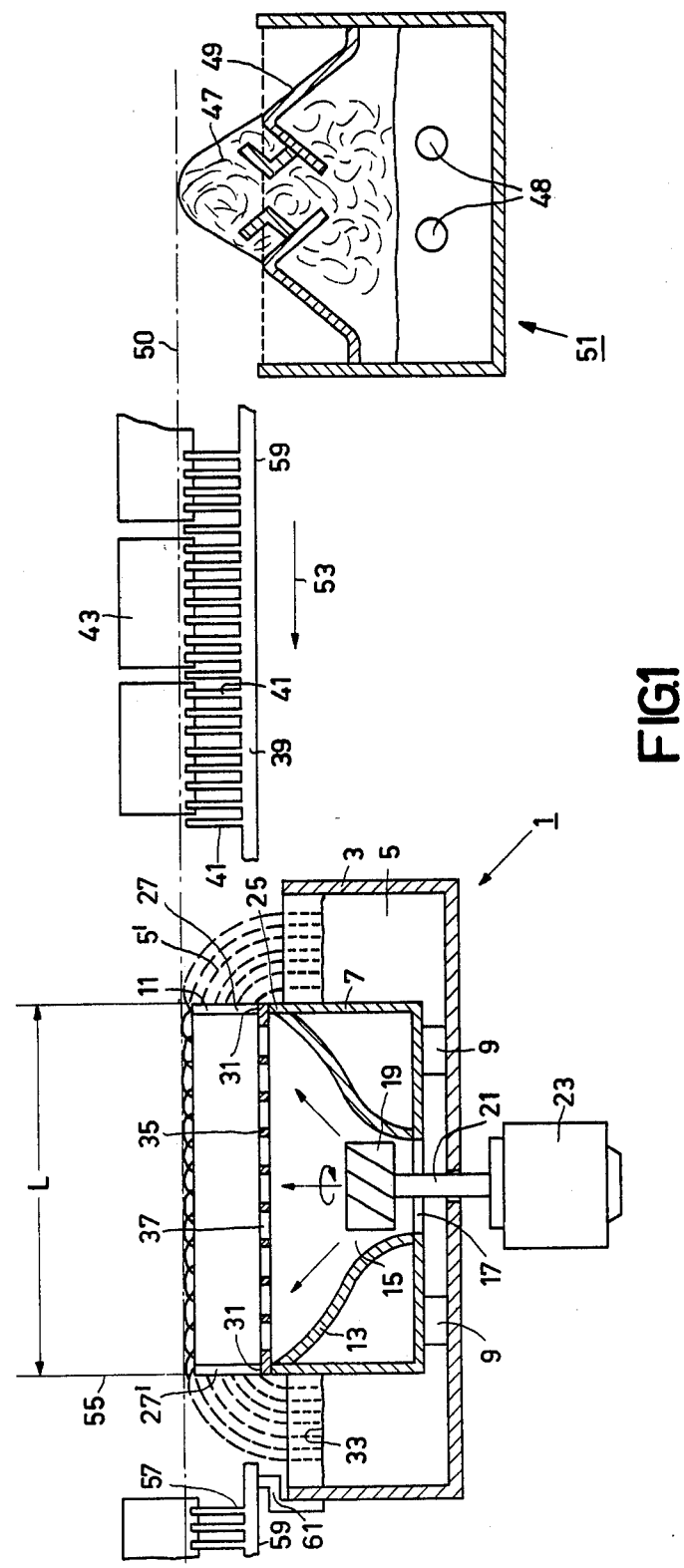
FIG. 1 is a sectional view of a soldering bath with a soldering nozzle and a preceding device which utilizes a foam wave for the application of a flux.

FIG. 1 shows a soldering tank 3 of a soldering bath 1 with solder 5. The solder is heated to the liquid state by a heating device (not shown). In the tank 3 there is provided a soldering nozzle 7. This soldering nozzle stands in the tank 3 of the soldering bath 1 on legs 9.

An upper collar 11 of the soldering nozzle projects from the tank 3. The soldering nozzle 7 includes guide plates 13 which form a flow duct 15. This flow duct 15 starts at a lower inlet 17 where a circulation impeller 19 is provided. The impeller 19 is driven by a motor 23 via a shaft 21. Above the circulation impeller 19, the flow duct 15 widens to the full width of the soldering nozzle 7.

Figure 2:
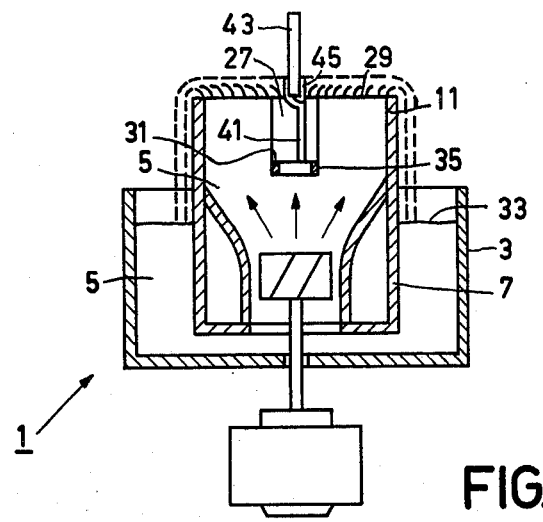
FIG. 2 is a sectional view, taken along the line II—II in FIG. 3, of the soldering bath.
Figure 3:
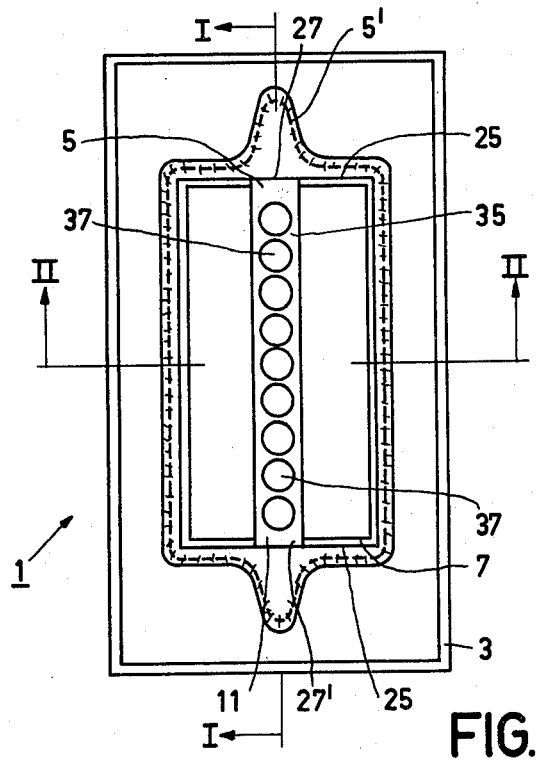
FIG. 3 is a plan view of the soldering bath.

As is clearly shown in the FIGS. 2 and 3, the narrow sides 25 of the soldering nozzle 7 comprise slitshaped recesses 27, 27' which extend from the upper rim 29 of the soldering nozzle 7 in the direction of the tank 3 of the soldering bath 1 and the lower edges 31 of which terminate above the level 33 of the solder in the tank 3. As is shown clearly in FIG. 2, the width of the top opening of the nozzle 7 at the upper rim 29, is greater than the width of the recess 27; and the recess width is greater than that of the carrier strip 39 and pins 41. Between the lower edges 31 of the recesses 27, 27' in the narrow sides 25 of the soldering nozzle there is provided a supporting strip 35 which comprises holes 37 as shown in FIG. 3.

Soldering is performed as follows. The endless carrier strip 39 carries thick-film hybrid modules 43 by means of the connection pins 41 which project vertically upwards. To this end, the connection pins 41 comprise clamping tulips 45 in which the thick-film modules are clamped.

The endless carrier strip 39 with the connection pins 41 and the thick-film hybrid modules 43 in the upright position shown in FIG. 1 is first pulled through a foam wave 47 which is generated in a wetting device 51 and which consists of a flux. The foam is produced by blowing air into the flux via pipes 48 and rises between the covers 49 to a level 50 which corresponds to the upper level in the soldering nozzle. The flux wets the carrier strip 39, the connection pins 41 and the printed circuit boards 43 up to the level 50. The carrier strip subsequently passes through a drying zone between the wetting device 51 and the soldering bath 1 in the direction of the arrow 53. The carrier strip 39 and the parts 41, 43 thereon then enter the solder wave 5' which flows radially downwards from the recess 27, situated at the entrance of the soldering nozzle 7 into the tank 3 against the transport direction. The carrier strip 39 bears on the supporting strip 37 inside the soldering nozzle 7. The solder pumped upwards by means of the impeller 19 reaches exactly the level denoted by the line 50. At the level of the solder surface, the solder radially flows off the parts 39, 41, 43 passing through the soldering nozzle to all sides in the direction of the overflow rim 11 and over the overflow rim back into the tank 3. Thus, in the vicinity of the parts 39, 41 and 43 to be soldered which are passed through the soldering bath an absolutely constant solder level 50 is obtained.

The soldering path within the soldering nozzle 7 is determined by the length L thereof. In conjunction with a given transport rate, this length results in a predetermined solder contact time. The length L can thus influence the transport rate, for example, so that the transport rate is increased by increasing the length L.

At the end 55 of the soldering path, the carrier strip 39 with the connection pins 41 and the printed circuit boards 43 leaves the soldering nozzle 7 again, i.e. via the recess 27' situated at the end thereof. From this recess at the end of the soldering path L the solder flows downwards in the transport direction into the tank 3 to the level 33 of the solder 5. During the downward-flow of the solder, notably the solder at the bases 57 of the connection pins which does not wet the strip 39 is also returned to the tank 3. As a result, no solder bridges remain at the bases 57.

However, solder or slack residues are liable to adhere to the lower side 59 of the carrier strip 39. These residues are removed by means of a scraper 61 situated behind the soldering bath.

What is claimed is:

1. A method of soldering connection pins to printed circuit boards, comprising:

supplying an elongated carrier strip carrying a multiplicity of connection pins attached thereto and extending vertically upward from the strip with a plurality of printed circuit boards aligned upright above the strip, a plurality of adjoining connection pins having their upper ends attached to each respective printed circuit board along a lower edge of the printed circuit board, passing the strip horizontally in its longitudinal direction throught a bath of liquid solder, while maintaining the alignment of the pins and boards above the strip, maintaining the solder bath depth sufficient to rise a given distance above the lower edge of the printed circuit boards, and causing solder to flow in the direction of strip movement at the location where the strip moves out of the bath, and removing the solder flow from solder-wet parts to a level below the strip.

2. A method as claimed in claim 1, further including the step of scraping solder, which has not wetted the carrier strip, from the under surface of the carrier strip after it leaves the bath.

3. An apparatus for soldering elements to the lower edge of an upright board, comprising a bath of molten solder, a soldering nozzle projecting upward from the bath, and means for circulating solder up into the nozzle, characterized in that said nozzle comprises an overflow rim having two recesses in the rim disposed opposite each other, lower edges of the recesses being arranged above the level of solder in the bath; and a supporting strip extending between said lower edges for supporting a carrier strip carrying elements to be soldered and being transported through the solder, and said nozzle having a top opening having a width, transverse to the transport direction of the carrier strip, greater than the width of the recesses; and said recesses having a width greater than that of a carrier strip and elements being transported through the bath, such that there is a flow of liquid solder past a carrier strip and elements being transported through the recess, in the direction of transport at the recess where such strip leaves the bath.

4. An apparatus as claimed in claim 3, characterized in that said supporting strip comprises a plurality of aperatures for flow of solder therethrough past a carrier strip being transported through the solder.

5. An apparatus as claimed in claim 4, characterized in that the apparatus further comprises a scraper arranged for scraping solder from the underside of a carrier strip which has been transported through and out of the bath.

* * * * *

UNITED STATES PATENT AND TRADEMARK OFFICE
CERTIFICATE OF CORRECTION

PATENT NO. : 4,410,127
DATED : October 18, 1983
INVENTOR(S) : Manfred BODEWIG

It is certified that error appears in the above—identified patent and that said Letters Patent is hereby corrected as shown below:

Claim 3, Col. 4, line 47, after "solder," delete "and"

Signed and Sealed this

Thirty-first Day of January 1984

[SEAL]

Attest:

GERALD J. MOSSINGHOFF

Attesting Officer

Commissioner of Patents and Trademarks